United States Patent
Zhu et al.

(10) Patent No.: US 8,759,857 B2
(45) Date of Patent: Jun. 24, 2014

(54) LIGHT EMITTING DIODE

(75) Inventors: Zhen-Dong Zhu, Beijing (CN); Qun-Qing Li, Beijing (CN); Li-Hui Zhang, Beijing (CN); Mo Chen, Beijing (CN); Shou-Shan Fan, Beijing (CN)

(73) Assignees: Tsinghua University, Beijing (CN); Hon Hai Precision Industry Co., Ltd., New Taipei (TW)

( * ) Notice: Subject to any disclaimer, the term of this patent is extended or adjusted under 35 U.S.C. 154(b) by 71 days.

(21) Appl. No.: 13/479,223

(22) Filed: May 23, 2012

(65) Prior Publication Data
US 2013/0140594 A1  Jun. 6, 2013

(30) Foreign Application Priority Data
Dec. 3, 2011 (CN) .......................... 2011 1 0395468

(51) Int. Cl.
*H01L 33/00* (2010.01)

(52) U.S. Cl.
USPC .. 257/98; 257/79; 257/E33.005; 257/E33.006

(58) Field of Classification Search
USPC ............... 257/79, 98, 99, E33.005, E33.006, 257/E33.067, E33.068, E33.074
See application file for complete search history.

(56) References Cited

U.S. PATENT DOCUMENTS

| | | | |
|---|---|---|---|
| 7,524,686 B2 * | 4/2009 | Chu et al. | 438/22 |
| 7,612,380 B2 * | 11/2009 | Son | 257/79 |
| 7,825,427 B2 * | 11/2010 | Xu et al. | 257/100 |
| 2003/0178626 A1 * | 9/2003 | Sugiyama et al. | 257/79 |
| 2004/0016936 A1 * | 1/2004 | Tanaka et al. | 257/98 |

* cited by examiner

*Primary Examiner* — Eduardo A Rodela
(74) *Attorney, Agent, or Firm* — Novak Druce Connolly Bove + Quigg LLP

(57) ABSTRACT

A light emitting diode including a substrate, a first semiconductor layer, an active layer, and a second semiconductor layer is provided. A surface of the substrate away from the active layer is configured as the light emitting surface. The first semiconductor layer includes a first surface and a second surface, and the first surface is connected to the substrate. The active layer and the second semiconductor layer are stacked on the second surface in that order. A first electrode electrically is connected with the first semiconductor layer. A second electrode is electrically connected with and covers a surface of the second semiconductor layer. A number of three-dimensional nano-structures are located on the surface of the first surface of the first semiconductor layer and the light emitting surface, and a cross section of each of the three-dimensional nano-structure is M-shaped.

20 Claims, 9 Drawing Sheets

LIGHT EMITTING DIODE

CROSS-REFERENCE TO RELATED APPLICATIONS

This application claims all benefits accruing under 35 U.S.C. §119 from China Patent Application No. 201113395473.2, filed on Dec. 3, 2011 in the China Intellectual Property Office, disclosure of which is incorporated herein by reference. This application is related to applications entitled, "LIGHT EMITTING DIODE", filed May 23, 2012 (Ser. No. 13/479,225); "LIGHT EMITTING DIODE", filed May 23, 2012 (Ser. No. 13/479,227); "METHOD FOR MAKING LIGHT EMITTING DIODE", filed May 23, 2012 (Ser. No. 13/479,229); "LIGHT EMITTING DIODE", filed May 23, 2012 (Ser. No. 13/479,230); "METHOD FOR MAKING LIGHT EMITTING DIODE", filed May 23, 2012 (Ser. No. 13/479,232); "LIGHT EMITTING DIODE", filed May 23, 2012 (Ser. No. 13/479,233); "METHOD FOR MAKING LIGHT EMITTING DIODE", filed May 23, 2012 Ser. No. 13/479,234); "LIGHT EMITTING DIODE", filed May 23, 2012 (Ser. No. 13/477,273).

BACKGROUND

1. Technical Field

The present disclosure relates to a light emitting diode (LED).

2. Description of the Related Art

LEDs are semiconductors that convert electrical energy into light. Compared to conventional light sources, the LEDs have higher energy conversion efficiency, higher radiance (i.e., they emit a larger quantity of light per unit area), longer lifetime, higher response speed, and better reliability. LEDs also generate less heat. Therefore, LED modules are widely used as light sources in optical imaging systems, such as displays, projectors, and so on.

LED commonly include an N-type semiconductor layer, a P-type semiconductor layer, an active layer, an N-type electrode, and a P-type electrode. The active layer is located between the N-type semiconductor layer and the P-type semiconductor layer. The P-type electrode is located on the P-type semiconductor layer. The N-type electrode is located on the N-type semiconductor layer. Typically, the P-type electrode is transparent. In operation, a positive voltage and a negative voltage are applied respectively to the P-type semiconductor layer and the N-type semiconductor layer. Thus, holes in the P-type semiconductor layer and photons in the N-type semiconductor layer can enter the active layer and combine with each other to emit visible light.

However, the extraction efficiency of LEDs is low because the contact area between the N-type semiconductor layer and the active layer is not large enough. Thus the electron-hole recombination density is low, and the photons in the LED are sparse, thereby degrading the extraction efficiency.

What is needed, therefore, is a light emitting diode which can overcome the above-described shortcomings.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
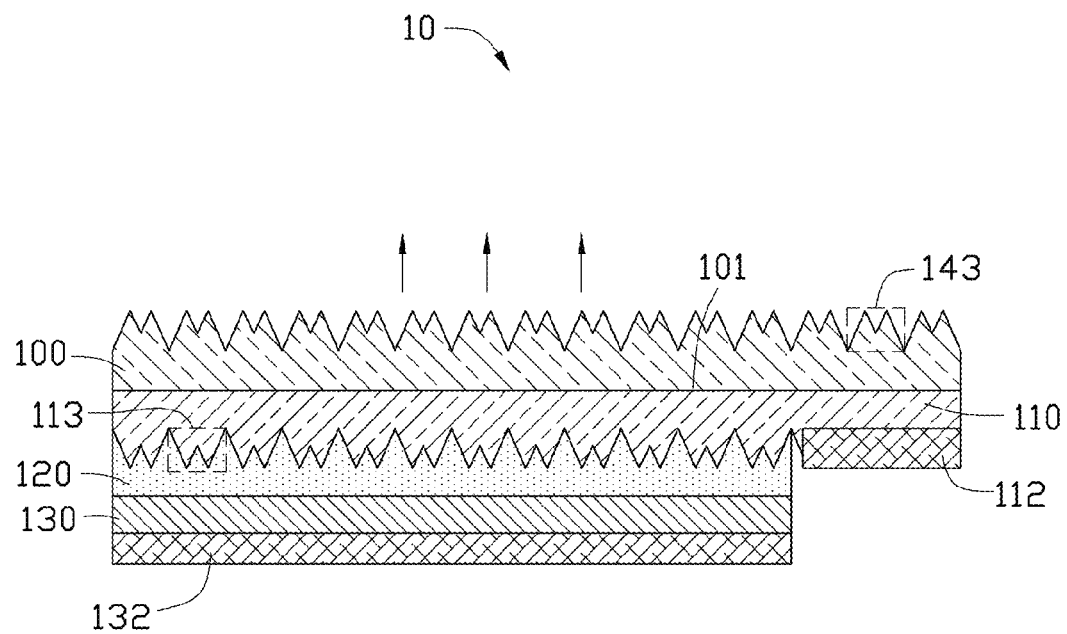
FIG. 1 shows a schematic view of one embodiment of an LED.

Referring to FIG. 1, one embodiment of an LED 10 includes a substrate 100, a first semiconductor layer 110, an active layer 120, a second semiconductor layer 130, a first electrode 112, and a second electrode 132. The first semiconductor layer 110 includes a first surface and a second surface opposite to the first surface. The substrate 100 contacts the first surface of the first semiconductor layer 110. The active layer 120 and the second semiconductor layer 130 are stacked on the second surface of the first semiconductor layer 110, and in that order. The surface of the substrate 100 away from the first semiconductor layer 110 is configured as the light emitting surface of the LED 10. The second surface of the first semiconductor layer 110 defines a plurality of three-dimensional nano-structures 143. The light emitting surface of LED 10 defines a plurality of three-dimensional nano structures 113. The first electrode 112 is electrically connected with the first semiconductor layer 110, and the second electrode 132 is electrically connected with and covers the surface of the second semiconductor layer 130.

The substrate 100 can be made of a transparent material and adapted to support the first semiconductor layer 110. A shape or a size of the substrate 100 is determined according to need. The substrate 100 includes an epitaxial growth surface 101 which is used to grow the first semiconductor layer 110. The epitaxial growth surface 101 is a clean and smooth surface. The substrate 100 can be a single-layer structure or a multi-layer structure. If the substrate 100 is a single-layer structure, the substrate 100 can be a single crystal structure having a crystal face used as the epitaxial growth surface 101. If the substrate 100 is a multi-layer structure, the substrate 100 should include at least one layer having the crystal face. The material of the substrate 100 can be GaAs, GaN, AlN, Si, SOL SiC, MgO, ZnO, LiGaO$_2$, LiAlO$_2$, or Al$_2$O$_3$. The first semiconductor layer 110 and the substrate 100 should have a small crystal lattice mismatch and a thermal expansion mismatch. The size, thickness, and shape of the substrate 100 can be selected according to need. In one embodiment, the substrate 100 is a sapphire substrate with a thickness of about 40 nm. The surface of the substrate 100 away from the first semiconductor layer 110 is configured as the light emitting surface of LED 10, and the light emitting surface is a patterned surface.

Figure 2:
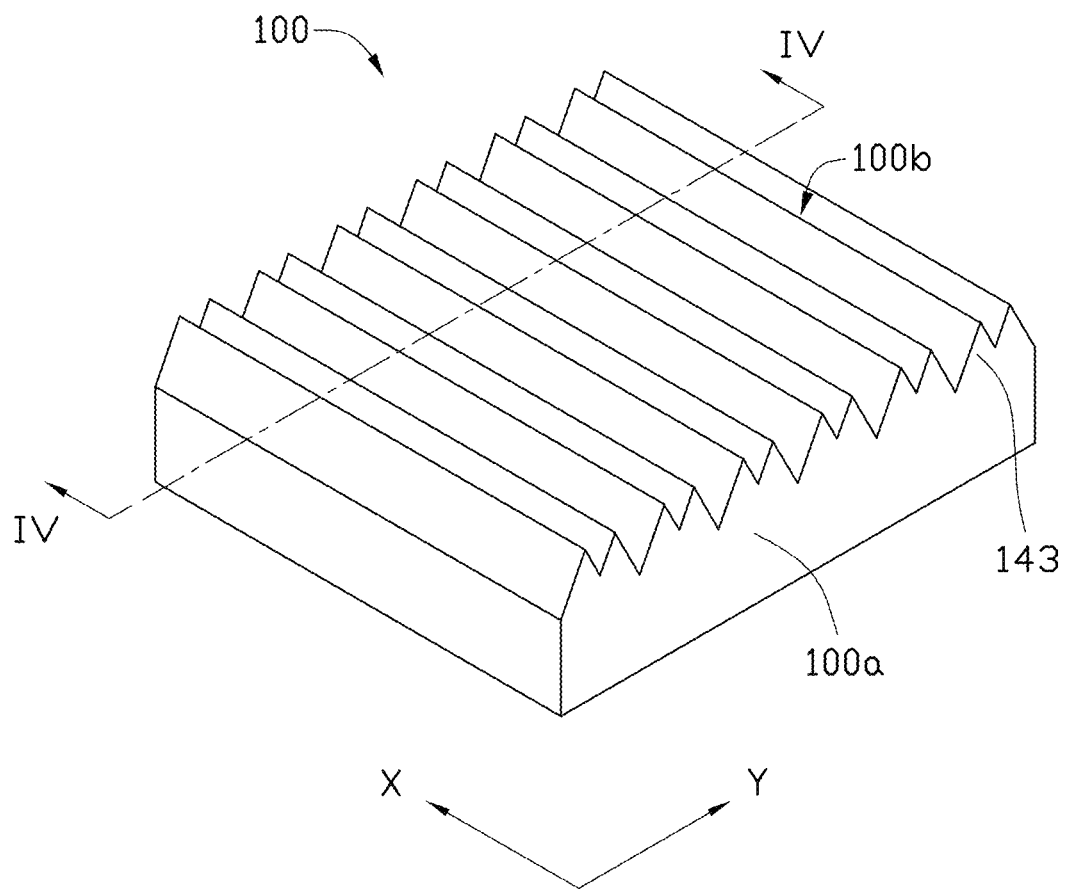
FIG. 2 is an isometric view of one embodiment of a three-dimensional nano-structures array in the LED of FIG. 1.

Referring to FIG. 1 and FIG. 2, the substrate 100 can be separated into a main body 100a and a protruding part 100b and distinguished by an "interface." The interface can be substantially parallel with the first surface of the first semiconductor layer 110. The interface is defined as a surface of the main body 100a hereafter, and the protruding part 100b is extending away from the surface of the main body 100a. The protruding part 100b defines the plurality of three-dimensional nano-structures 143, and the plurality of three-dimensional nano-structures 143 form the patterned surface of the first semiconductor layer 110. The three-dimensional nano-structure 143 can be a protruding structure. The protruding structure protrudes out from the interface of the main body 100a. The plurality of three-dimensional nano-structures 143 is a protruding structure located on the surface of the main body 100a.

Figure 3:
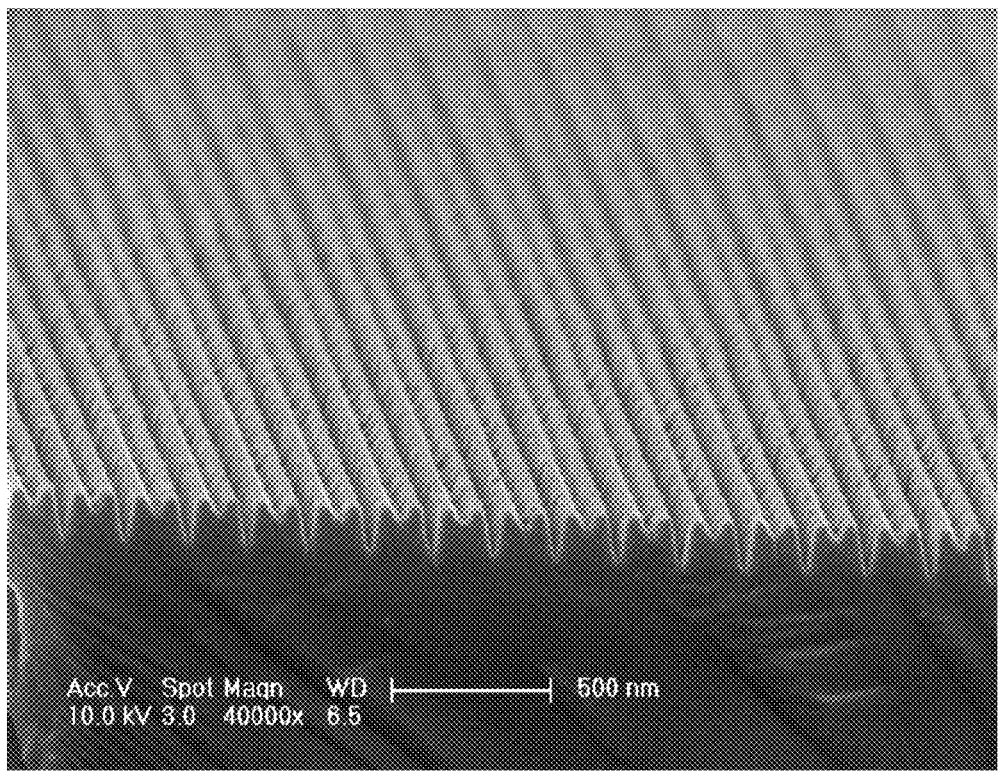
FIG. 3 shows a scanning electron microscope (SEM) image of the three-dimensional nano-structures array of FIG. 2.

The plurality of three-dimensional nano-structures 143 can be arranged side by side. Each of the three-dimensional nano-structures 143 can extend along a straight line, a curvy line, or a polygonal line. The extending direction is substantially parallel with the surface of the substrate 100. The two adjacent three-dimensional nano-structures are arranged a certain distance apart from each other. The distance ranges from about 0 nanometers to about 1000 nanometers, such as 10 nanometers, 30 nanometers or 200 nanometers. The extending direction of the three-dimensional nano-structure 143 can be fixed or varied. While the extending direction of the three-dimensional nano-structure 143 is fixed, the plurality of three-dimensional nano-structures 143 extends along a straight line, otherwise the three-dimensional nano-structures 143 extends along a polygonal line or a curvy line. The cross-section of the three-dimensional nano-structure 143 along the extending direction is M-shaped. Referring to FIG. 3, the three-dimensional nano-structures 143 are a plurality of substantially parallel bar-shaped protruding structures extending along a straight line. The plurality of three-dimensional nano-structures 143 are substantially uniformly and equidistantly distributed on the entire surface of the main body 100a.

Figure 4:
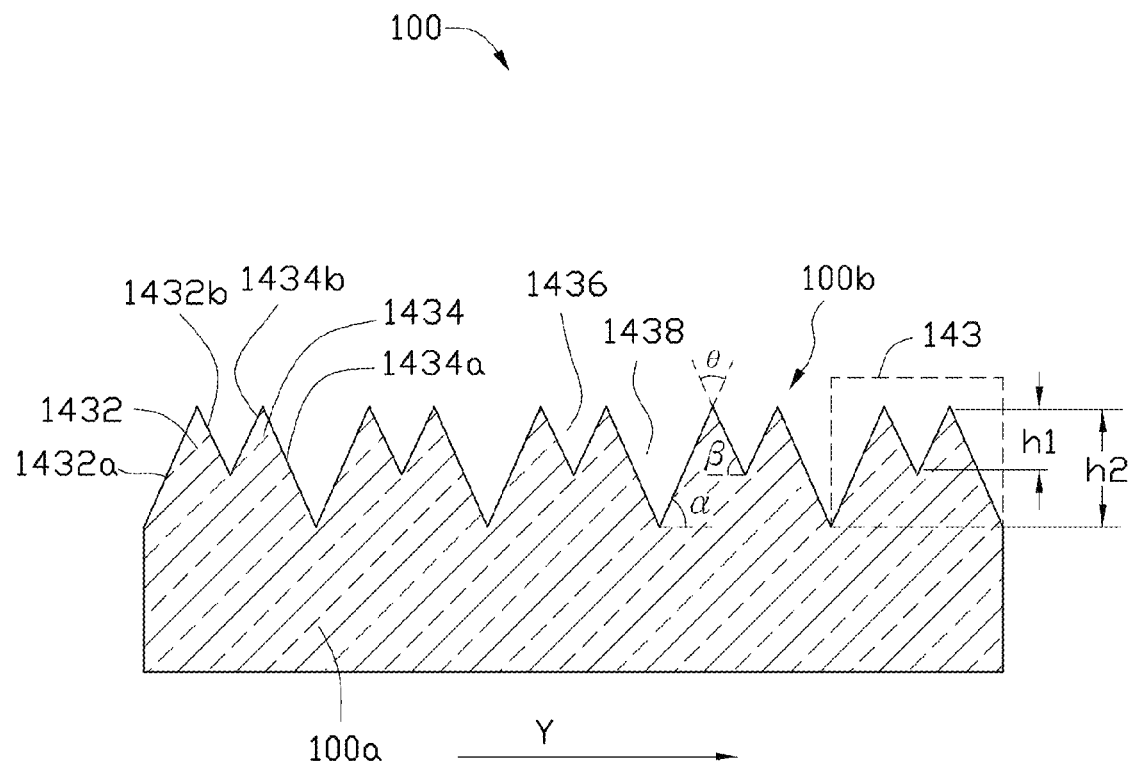
FIG. 4 shows cross-sectional view along a line IV-IV of FIG. 2.

Also referring to FIG. 4, the three-dimensional nano-structure 143 extends from one side of the substrate 100 to the opposite side along the X direction. The Y direction is substantially perpendicular to the X direction and substantially parallel with the surface of the main body 100a. The three-dimensional nano-structure 143 is a double-peak structure including two peaks. The cross-section of the double-peak structure is in the shape of M. The first peak 1432 and the second peak 1434 substantially extend along the X direction. The first peak 1432 includes a first surface 1432a and a second surface 1432b. The first surface 1432a and the second surface 1432b intersect to form an intersection line and an included angle θ of the first peak 1432. The intersection line can be a straight line, a curvy line, or a polygonal line. The included angle θ is greater than 0 degree and smaller than 180 degrees. In one embodiment, the included angle θ ranges from about 30 degrees to about 90 degrees. The first surface 1432a and the second surface 1432b can be planar, curvy, or wrinkly. In one embodiment, the first surface 1432a and the second surface 1432b are planar. The first surface 1432a intersects the surface of the main body 100a at an angle α. The angle α is greater than 0 degrees and less than or equal to 90 degrees. In one embodiment, the angle α is greater than 80 degrees and less than 90 degrees. The first surface 1432a includes a side connected to the surface of the substrate 100, and extends away from the main body 100a to intersect the second surface 1432b. The second surface 1432b includes a side connected with the second peak 1434 and extends away from the main body 100a at an angle β. The angle β is greater than 0 degrees and smaller than 90 degrees.

The second peak 1434 includes a third surface 1434a and a fourth surface 1434b. The structure of the second peak 1434 is substantially the same as that of the first peak 1432. The third surface 1434a and the fourth surface 1434b intersect each other to form the included angle of the second peak 1434. The third surface 1434a includes a side intersecting the surface of the main body 100a and extending away from the main body 100a to intersect the fourth surface 1434b. The fourth surface 1434b includes a side intersecting the third surface 1434a to form the included angle of the second peak 1434, and extending to intersect the second surface 1432b of the first peak 1432 to define a first groove 1436. A second groove 1438 is defined between two adjacent three-dimensional nano-structures 143. The second groove 1438 is defined by the third surface 1434a of the second peak 1434 and the first surface 1432a of the first peak 1432 of the adjacent three-dimensional nano-structure 143.

The first peak 1432 and the second peak 1434 protrude out of the main body 100a. The height of the first peak 1432 and the second peak 1434 is arbitrary and can be selected according to need. In one embodiment, both the height of the first peak 1432 and that of the second peak 1434 range from about 150 nanometers to about 200 nanometers. The height of the first peak 1432 can be substantially equal to that of the second peak 1434. The highest points of the first peak 1432 and the second peak 1434 are defined as the farthest point away from the surface of the main body 100a. In one three-dimensional nano-structure 143, the highest point of the first peak 1432 is spaced from that of the second peak 1434 a certain distance ranging from about 20 nanometers to about 100 nanometers. The first peak 1432 and the second peak 1434 extend substantially along the X direction. The cross-section of the first peak 1432 and the second peak 1434 can be trapezoidal or triangular, and the shape of the first peak 1432 and the second peak 1434 can be substantially the same. In one embodiment, the cross-sections of the first peak 1432 and the second peak 1434 are triangular. In one embodiment, the first peak 1432, the second peak 1434, and the main body 100a form an integrated structure. Because of the limitation of the technology, the first surface 1432a and the second surface 1432b cannot be absolutely planar.

In each M-shaped three-dimensional nano-structure 143, the first peak 1432 and the second peak 1434 define the first groove 1436. The extending direction of the first groove 1436 is substantially the same as the extending direction of the first peak 1432 and the second peak 1434. The cross-section of the first groove 1436 is V-shaped. The depth $h_1$ of the first groove 1436 in different three-dimensional nano-structures 143 is substantially the same. The depth $h_1$ is defined as the distance between the highest point of the first peak 1432 and the lowest point of the first groove 1436. The depth $h_1$ of the first groove 1436 is less than the height of the first peak 1432 and the second peak 1434.

The second groove 1438 extends substantially along the extending direction of the three-dimensional nano-structures 143. The cross-section of the second groove 1438 is V-shaped or an inverse trapezium. Along the extending direction, the cross-section of the second groove 1438 is substantially the same. The depth $h_2$ of the second grooves 1438 between each two adjacent three-dimensional nano-structures 143 is substantially the same. The depth $h_2$ is defined as the distance between the highest point and the lowest point of the groove of the second groove 1438. The depth $h_2$ of the second groove 1438 is greater than the depth of the first groove 1436, and the ratio between $h_1$ and $h_2$ ranges from about 1:1.2 to about 1:3 (1:1.2≤$h_1$:$h_2$≤1:3). The depth of the first groove 1436 ranges from about 30 nanometers to about 120 nanometers, and the depth of the second groove 1438 ranges from about 90 nanometers to about 200 nanometers. In one embodiment, the depth of the first groove 1436 is about 80 nanometers, and the depth of the second groove 1438 is about 180 nanometers. The depth of the first groove 1436 and the second groove 1438 can be selected according to need.

The width of the three-dimensional nano-structure 143 ranges from about 100 nanometers to about 200 nanometers. The width of the three-dimensional nano-structure 143 is defined as the maximum span of the three-dimensional nano-structure 143 along the Y direction. The span of the three-dimensional nano-structure 143 is gradually decreased along the direction away from the substrate 100. Thus in each three-dimensional nano-structure 143, the distance between the highest point of the first peak 1432 and the highest point of the second peak 1434 is less than the width of the three-dimensional nano-structure 143. The plurality of three-dimensional nano-structures 143 can be distributed in a certain interval from each other, and the intervals can be substantially the same. The interval forms the second groove 1438. The distance $\lambda_0$ between the two adjacent three-dimensional nano-structures 120 ranges from about 0 nanometers to about 200 nanometers. The distance between each two adjacent three-dimensional nano-structures 120 can be substantially the same. The distance $\lambda_0$ can be increased with the increase of the height of both the first peak 1432 and second peak 1434, and decreased with the decrease of the height of both the first 1432 and second peaks 1434. In the Y direction, the distance $\lambda_0$ can be increased, decreased, or periodically varied. If the distance $\lambda_0$=0, the cross-section of the second groove 1438 is V-shaped. If the distance $\lambda_0$>0, the cross-section of the second groove 1438 is in the shape of an inverse trapezium.

Along the Y direction, the plurality of three-dimensional nano-structures 143 is distributed in a certain period P. One period P is defined as the width $\lambda$ of the three-dimensional nano-structures 143 added with the distance $\lambda_0$. The period P of the plurality of three-dimensional nano-structures 143 can range from about 100 nanometers to about 500 nanometers. The period P, the width $\lambda$, and the distance $\lambda_0$ satisfy the following formula: P=$\lambda$+$\lambda_0$. The period P, the width $\lambda$, and the distance $\lambda_0$ is measured in nanometers. The period P can be a constant, and $\lambda_0$ or $\lambda$ can be a dependent variable. Furthermore, one part of the three-dimensional nano-structures 143 can be aligned in a first period, and another part of the three-dimensional nano-structures 143 can be aligned in a second period. In one embodiment, the period P is about 200 nanometers, the width $\lambda$ is about 190 nanometers, and the distance $\lambda_0$ is about 10 nanometers.

The plurality of three-dimensional nano-structures 143 change the direction of the moving photons reaching the light emitting surface with a large incident angle, so that these photons can be extracted from the light emitting surface. Furthermore, because the three-dimensional nano-structure 143 is M-shaped, the M-shaped three-dimensional nano-structures 143 can function as two layers of the three-dimensional nano-structure assembled together. The light extraction efficiency of the LED 10 will be improved.

The first semiconductor layer 110 is formed on the epitaxial growth surface 101 of substrate 100. The first semiconductor layer 110 is an N-type semiconductor or a P-type semiconductor. The material of the N-type semiconductor can include N-type gallium nitride, N-type gallium arsenide, or N-type copper phosphate. The material of the P-type semiconductor can include P-type gallium nitride, P-type gallium arsenide, or P-type copper phosphate. The N-type semiconductor is configured to provide photons, and the P-type semiconductor is configured to provide holes. The thickness of the first semiconductor layer 110 ranges from about 1 μm to about 5 μm. In one embodiment, the first semiconductor layer 110 is an N-type gallium nitride doped with Si. The first semiconductor layer 110 includes a first surface and a second surface opposite to the first surface. The first surface is contacting the substrate 100. The second surface includes a first region and a second region based on their function. The first region is used to locate the active layer 120 and the second semiconductor layer 130, and the second region is used to locate the first electrode 112.

Furthermore, the second surface of the first semiconductor layer 110 defines the plurality of three-dimensional nano-structures 113 to form a patterned surface. The three-dimensional nano-structures 113 is located on the first region of the first semiconductor layer 110. The structure of the three-dimensional nano-structures 113 is the same as the structure of the three-dimensional nano-structures 143. The three-dimensional nano-structure 113 is a protruding structure extending away from the first semiconductor layer 110. The plurality of three-dimensional nano-structures 113 can be arranged side by side. The extending direction of the three-dimensional nanostructures 113 can be fixed or varied. The cross-section of the three-dimensional nanostructure 113 along the extending direction is M-shaped. Each M-shaped three-dimensional nano-structure 113 includes a first peak 1132 and a second peak 1134 extending along the same direction. A first groove 1136 is defined between the first peak 1132 and the second peak 1134. A second groove 1138 is defined between the two adjacent three-dimensional nano-structures 113. The depth of the first groove 1136 is smaller than the depth of the second groove 1138.

In one embodiment, a buffer layer (not shown) can be sandwiched between the substrate 100 and the first semiconductor layer 110. Because the first semiconductor layer 110 and the substrate 100 have different lattice constants, the buffer layer is used to reduce the lattice mismatch, thus the dislocation density of the first semiconductor layer 110 will decrease. The thickness of the buffer layer ranges from about 10 nanometers to about 300 nanometers, and the material of the buffer layer can be GaN or AlN.

The active layer 120 is located on the first region of the second surface of the first semiconductor layer 110. In one embodiment, the active layer 120 covers the entire surface of the first region. The active layer 120 is engaged with the first semiconductor layer 110. In detail, the active layer 120 covers the plurality of three-dimensional nano-structures 113, and the surface of the active layer 120 which is connected with the first semiconductor layer 110 forms a patterned surface. The active layer 120 also includes a plurality of grooves and peaks, the grooves being engaged with the first peaks 1132 and second peaks 1134, the peaks being engaged with the first grooves 1136 and second grooves 1138. The active layer 120 is a photon excitation layer and can be one of a single layer quantum well film or multilayer quantum well films. The active layer 120 is made of GaInN, AlGaInN, GaSn, AlGaSn, GaInP, or GaInSn. In one embodiment, the active layer 120 has a thickness of about 0.3 μm and includes one layer of GaInN and another layer of GaN. The GaInN layer is stacked with the GaN layer.

Figure 5:
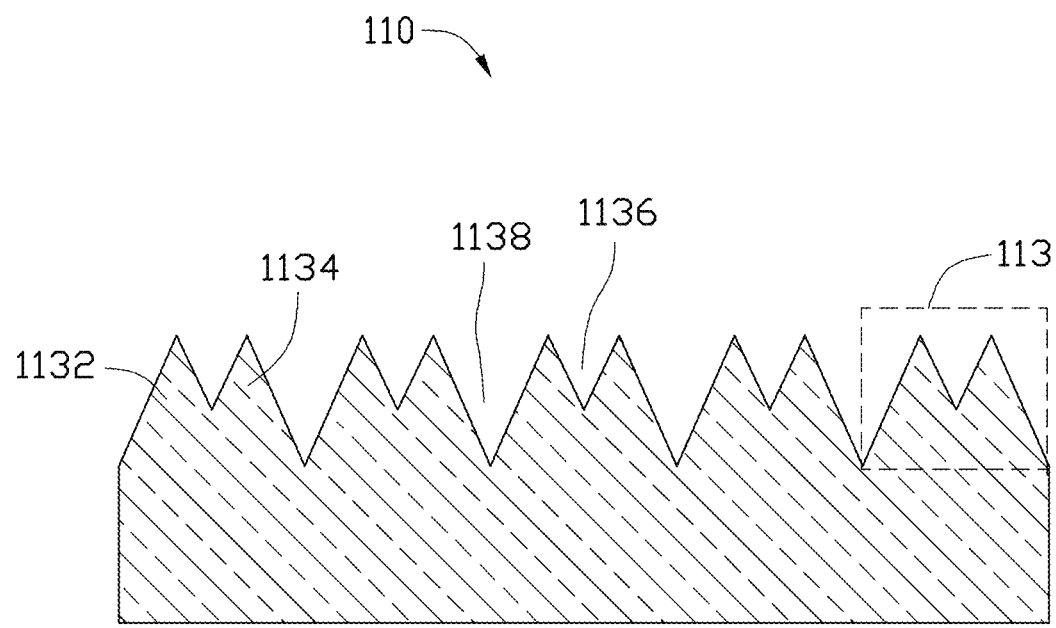
FIG. 5 shows a schematic view of the second semiconductor layer of FIG. 1.

Referring to FIG. 5, the second semiconductor layer 130 is located on the active layer 120. The surface of the second semiconductor layer 130 away from the active layer 120 is configured as the light emitting surface of LED 10. In one embodiment, the second semiconductor layer 130 covers the entire surface of the active layer 120 away from the substrate 100. The thickness of the second semiconductor layer 130 ranges from about 0.1 μm to about 3 μm. The second semiconductor layer 130 can be an N-type semiconductor layer or a P-type semiconductor layer. Furthermore, the type of the second semiconductor layer 130 is different from the type of the first semiconductor layer 110. In one embodiment the second semiconductor layer 130 is a P-type gallium nitride doped with Mg.

The first electrode 112 is electrically connected with the first semiconductor layer 110 and spaced from the active layer 120. The first electrode 112 covers at least part of the surface of the second region. The first electrode 112 is a single layer structure or a multi-layer structure. The first electrode 112 can be an N-type electrode or a P-type electrode according the first semiconductor layer 110. The material of the first electrode 112 can be selected from Ti, Ag, Al, Ni, Au, or any combination of them. The material of the first electrode 112 can also be indium-tin oxide (ITO) or carbon nanotube film. In one embodiment, the first electrode 112 is a two-layer structure consisted of a Ti layer with about 15 nm in thickness and an Au layer with about 100 nm in thickness.

The second electrode 132 can be an N-type electrode or P-type electrode. In one embodiment, the second electrode 132 covers the surface of the second semiconductor layer 130 away from the active layer 120. The type of the second electrode 132 is the same as the second semiconductor layer 130. The shape of the second electrode 132 is arbitrary and can be selected according to need. The second electrode 132 covers a part of the surface or the entire surface of the second semiconductor layer 130. The material of the second electrode 132 can be Ti, Ag, Al, Ni, Au or any combination of them. The second electrode 132 is also configured as a reflector to reflect photons.

Furthermore, a reflector layer (not shown) can be located on the surface of second semiconductor layer 130 away from the active layer 120. The material of the reflector can be Ti, Ag, Al, Ni, Au or any combination thereof. The reflector includes a smooth surface having a high reflectivity. The photons reach the reflector and will be reflected by the reflector, thus these photons can be extracted out of the LED 10 to improve the light extraction efficiency of the LED 10.

The first semiconductor layer 110 includes a plurality of three-dimensional nano-structures to form a patterned surface, and the active layer 120 is located on the patterned surface, thus the contact area between the first semiconductor layer 110 and the active layer 120 is enlarged. The electron-hole recombination density is improved, and the quantity of photons is increased. The light extraction efficiency of the LED 10 can be improved.

One embodiment of a method for making the LED 10 includes the following steps:

S11, providing a substrate 100 with an epitaxial growth surface 101;

S12, forming a plurality of three-dimensional nano-structures 143 on the surface of the substrate opposite to the epitaxial growth surface 101;

S13, growing a first semiconductor layer 110 on the epitaxial growth surface 101;

S14, forming a plurality of three-dimensional nano-structures 113 on the first semiconductor layer 110;

S15, growing an active layer 120 and a second semiconductor layer 130 on the surface of the plurality of three-dimensional nano-structures 143 in that order;

S16, applying a first electrode 112 electrically connected to the first semiconductor layer 110; and S17, locating a second electrode 132 to cover the surface of the second semiconductor layer 130.

Figure 6:
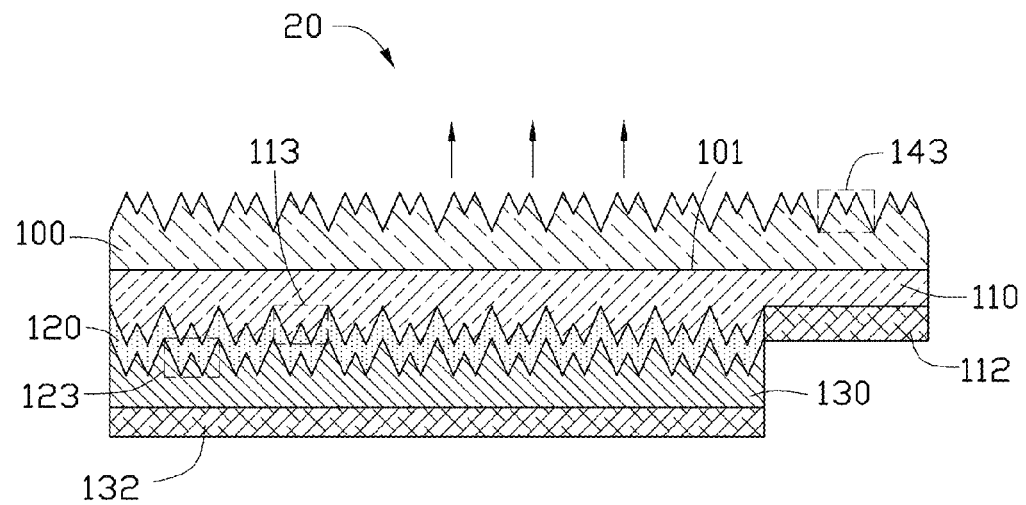
FIG. 6 shows a schematic view of another embodiment of an LED.

Referring to FIG. 6, another embodiment of an LED 20 includes a substrate 100, a first semiconductor layer 110, an active layer 120, a second semiconductor layer 130, a first electrode 112, and a second electrode 132. The substrate 100 includes an epitaxial growth surface 101. The first semiconductor layer 110 includes a first surface and an opposite second surface. The first surface is in contact with the epitaxial growth surface 101 of the substrate 100. The active layer 120 and the second semiconductor layer 130 are stacked on the second surface and in that order. The surface of the substrate 100 away from the first semiconductor layer 110 is configured as the light emitting surface of the LED 10, and the light emitting surface defines a plurality of three-dimensional nano-structures 143. The second surface of the first semiconductor layer defines a plurality of three-dimensional nano-structures 113. The surface of the active layer 120 away from the first semiconductor layer 110 defines a plurality of three-dimensional nano-structures 123. The light emitting surface of LED 10 defines a plurality of three-dimensional nano-structures 113. The first electrode 112 is electrically connected with the first semiconductor layer 110, and the second electrode 132 is electrically connected with and covering the surface of the second semiconductor layer 130. The plurality of three-dimensional nano-structures 123 is located on the surface of the active layer 120 away from the first semiconductor layer 110. The structure of the LED 20 is similar to that of the LED 10, but further includes the plurality of three-dimensional nano-structures 123 located on the active layer 120 away from the first semiconductor layer 110.

Figure 7:
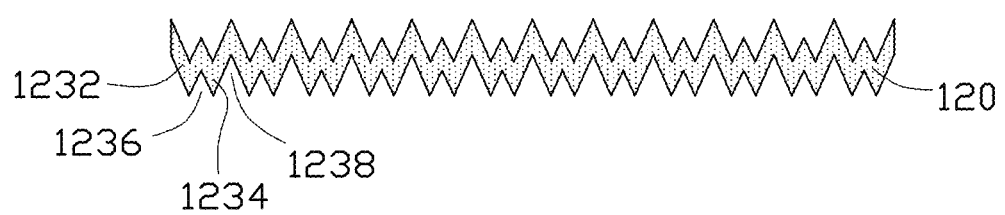
FIG. 7 shows a schematic view of the active layer of FIG. 6.

Further referring to FIG. 7 the plurality of three-dimensional nano-structures 123 forms a patterned surface on the active layer 120. The three-dimensional nano-structure 123 is similar to the three-dimensional nano-structures 113. Each three-dimensional nano-structure 123 includes a first peak 1232 and a second peak 1234, a first groove 1236 defined between the first peak 1232 and the second peak 1234, and a second groove 1238 defined between two adjacent three-dimensional nano-structures 123. The distribution and alignment of the three-dimensional nano-structures 123 is the same as the distribution and alignment of the three-dimensional nano-structures 113. The second semiconductor layer 130 is located on the surface of the three-dimensional nano-structures 143, thus the surface of the second semiconductor layer 130 near the active layer 120 forms a patterned surface.

In the LED 20, the surface of the second semiconductor layer contacting the active layer also includes a plurality of three-dimensional nano-structures, thus the contact area between the semiconductor layer and the active layer is also enlarged. The electron-hole recombination density is further increased, and the light extraction efficiency of the LED 20 is improved.

One embodiment of a method for making the LED 20 includes the following steps:

S21, providing a substrate 100 having an epitaxial growth surface 101;

S22, forming a plurality of three-dimensional nano-structures 143 on the surface of the substrate 100 opposite to the epitaxial growth surface 101;

S23, growing a first semiconductor layer 110;

S24, forming a plurality of three-dimensional nano-structures 113 on a surface of the semiconductor layer 110;

S25, growing an active layer 120 on the surface of the three-dimensional nano-structures 113, and forming a plurality of three-dimensional nano-structures 123 on the surface away from the first semiconductor layer 110;

S26, growing a second semiconductor layer 130 on the surface of three-dimensional nano-structures 123;

S27, applying a first electrode 112 on the surface of the first semiconductor layer 110; and S28, applying a second electrode 132 to electrically connect to and cover the surface of the second semiconductor layer 130.

The method of making the LED 20 is similar to the method for making the LED 10, except that the LED 20 further forms the plurality of three-dimensional nano-structures 123 on the surface of the active layer 120 away from the first semiconductor layer 110. The substrate 100 with the first semiconductor layer 110 is located in a vertical epitaxial growth reactor, and the active layer 120 grows by a vertical epitaxial growth method. Thus the distribution and alignment of the three-dimensional nano-structure 123 is the same as the distribution and alignment of the three-dimensional nano-structure 113.

Figure 8:
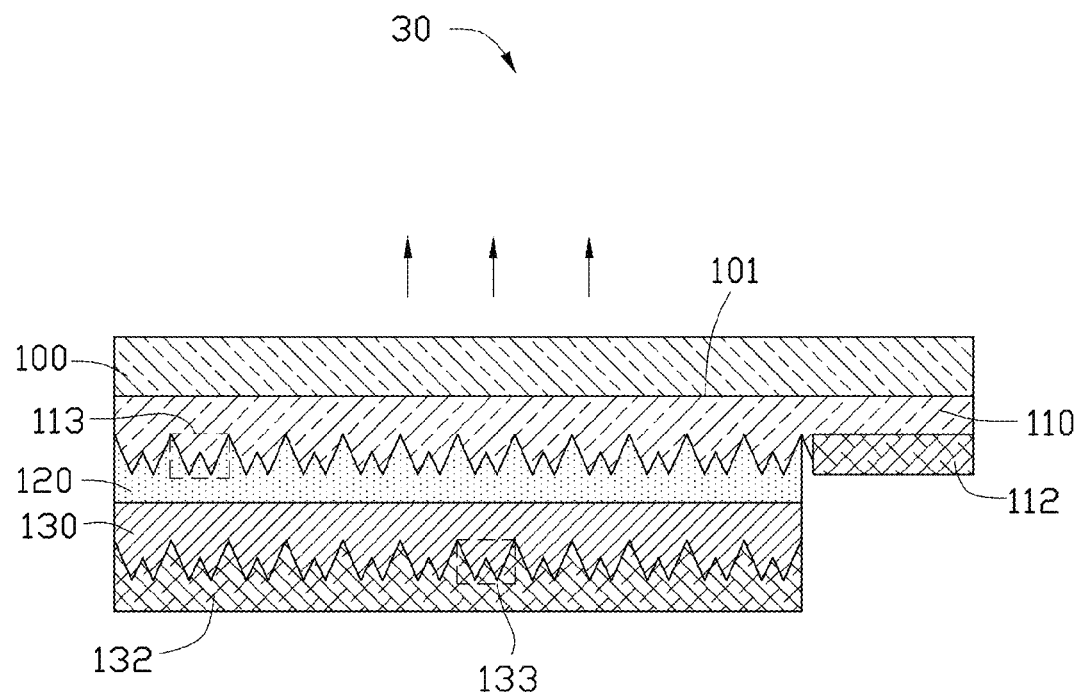
FIG. 8 shows a schematic view of another embodiment of an LED.

Referring to FIG. 8, another embodiment of an LED 30 includes a substrate 100, a first semiconductor layer 110, an active layer 120, a second semiconductor layer 130, a first electrode 112, and a second electrode 132. The first semiconductor layer 110 includes a first surface and the second surface opposite to the first surface. The substrate 100 contacts the first surface of the first semiconductor layer 110. The active layer 120 and the second semiconductor layer 130 are stacked on the second surface of the first semiconductor layer 110 in that order. The surface of the substrate 100 away from the first semiconductor layer 110 is configured as the light emitting surface of LED 10. The second surface of the first semiconductor layer 110 defines a plurality of three-dimensional nano-structures 113. The surface of the substrate 100 contacting the first semiconductor layer 110 defines a plurality of three-dimensional nano-structures 133. The first electrode 112 is electrically connected with the first semiconductor layer 110, and the second electrode 132 is electrically connected with and covers the surface of the second semiconductor layer 130. The structure of the LED 30 is similar to that of the LED 10, but further includes the plurality of three-dimensional nano-structures 133 located on the surface of the second semiconductor layer 130 contacting the first electrode 132.

The plurality of three-dimensional nano-structures 133 forms a patterned surface. The three-dimensional nano-structure 133 is similar to the three-dimensional nano-structures 113. The distribution and alignment of the three-dimensional nano-structures 133 is the same as the distribution and alignment of the three-dimensional nano-structures 113. The first electrode 132 covers the surface of the three-dimensional nano-structures 133.

One embodiment of a method for making the LED 30 includes the following steps:

S31, providing a substrate 100 having a patterned epitaxial growth surface 101;

S32, growing a first semiconductor layer 110 on the patterned epitaxial growth surface 101;

S33, forming a plurality of three-dimensional nano-structures 143 on a surface of the semiconductor layer 110;

S34, growing an active layer 120 and a second semiconductor layer 130 on the surface of three-dimensional nano-structures 113;

S35, forming a plurality of three-dimensional nano-structures 133 on the surface of the semiconductor layer 130;

S36, applying a first electrode 112 on the surface of the first semiconductor layer 110; and S37, applying a second electrode 132 to electrically connect to and cover the second semiconductor layer 130.

Photons reaching the plurality of three-dimensional nano-structures 133 with a large incident angle can be reflected, changing the motion direction of the photons so that these photons can be extracted from the light emitting surface. Furthermore, because the three-dimensional nano-structure 133 is M-shaped, the three-dimensional nano-structures 133 can function as two layers of three-dimensional nano-structure assembled together, and the light extraction efficiency of the LED 30 will be improved.

Figure 9:
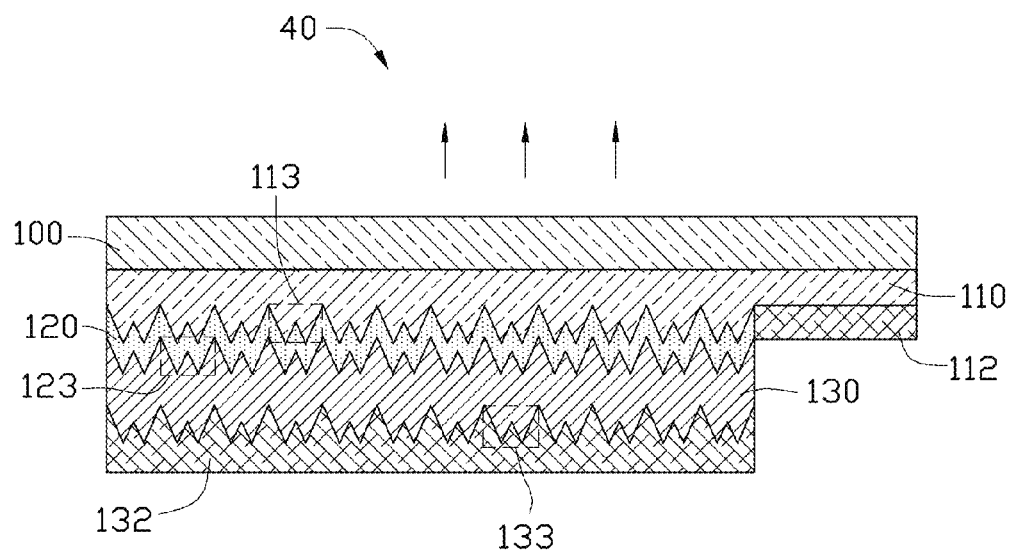
FIG. 9 shows a schematic view of another embodiment of an LED.

Referring to FIG. 9, another embodiment of an LED 40 includes a substrate 100, a first semiconductor layer 110, an active layer 120, a second semiconductor layer 130, a first electrode 112, and a second electrode 132. The first semiconductor layer 110 includes a first surface and the second surface opposite to the first surface. The substrate 100 includes a epitaxial growth surface 101 contacting with the first surface of the first semiconductor layer 110. The active layer 120 and the second semiconductor layer 130 are stacked on the second surface of the first semiconductor layer 110 in that order. The surface of the substrate 100 away from the active layer 120 is configured as the light emitting surface of the LED 10. The second surface of the first semiconductor layer 110 defines a plurality of three-dimensional nano-structures 113. The surface of the active layer 120 away from the first semiconductor layer 110 defines a plurality of three-dimensional nano-structures 123. The surface of the second semiconductor layer 130 away from the active layer 120 defines a plurality of three-dimensional nano-structures 133. The first electrode 112 is electrically connected with the first semiconductor layer 110, and the second electrode 132 is electrically connected with and covers the surface of the second semiconductor layer 130. The structure of the LED 40 is similar to that of the LED 30, but further includes the plurality of three-dimensional nano-structures 123 located on the surface of the active layer 120 away from the first semiconductor 110.

The three-dimensional nano-structure 123 is similar to the three-dimensional nano-structures 113. The distribution and alignment of the three-dimensional nano-structures 123 is same as that of the three-dimensional nano-structures 113

Depending on the embodiment, certain of the steps of methods described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

It is to be understood that the above-described embodiments are intended to illustrate rather than limit the disclosure. Variations may be made to the embodiments without departing from the spirit of the disclosure as claimed. It is understood that any element of any one embodiment is considered to be disclosed to be incorporated with any other embodiment. The above-described embodiments illustrate the scope of the disclosure but do not restrict the scope of the disclosure.

What is claimed is:

1. A light emitting diode, comprising:
a substrate having an epitaxial growth surface and a light emitting surface opposite the epitaxial growth surface;
a first semiconductor layer having a first surface contacting the substrate and a second surface opposite to the first surface, the first surface;
an active layer stacked on the second surface of the first semiconductor layer;

a second semiconductor layer stacked on the active layer;
a first electrode electrically connected with the first semiconductor layer;
a second electrode electrically connected with and covering the surface of the second semiconductor layer away from the active layer; and
a plurality of three-dimensional nano-structures located on the second surface of the first semiconductor layer and on the light emitting surface, wherein each of the plurality of three-dimensional nano-structures has a first peak and a second peak aligned side by side, a first groove is defined between the first peak and the second peak, a second groove is defined between each two adjacent three-dimensional nano-structures of the plurality of three-dimensional nano-structures, and a depth of the first groove is less than a depth of the second groove.

2. The light emitting diode of claim 1, wherein each of the plurality of three-dimensional nano-structures is a bar-shaped protruding structure extending along a straight line, a curve line, or a polygonal line.

3. The light emitting diode of claim 1, wherein a cross-section of each of the three-dimensional nano-structure is M-shaped.

4. The three-dimensional nano-structure array of claim 1, wherein the first peak comprises a first surface and a second surface intersecting each other to form a first include angle, the second peak comprises a third surface and a fourth surface intersecting each other to form a second include angle, and both the first include angle and the second include angle range from about 30 degrees to about 90 degrees.

5. The light emitting diode of claim 4, wherein a cross-section of the first peak has a shape of a trapezoid or a triangle, and a cross-section of the second peak has a shape of a trapezoid or a triangle.

6. The light emitting diode of claim 1, wherein a surface of the active layer is engaged with the plurality of three-dimensional nano-structures located on the first semiconductor layer.

7. The light emitting diode of claim 1, wherein the depth of the first groove ranges from about 30 nanometers to about 120 nanometers, and the depth of the second groove ranges from about 100 nanometers to about 200 nanometers.

8. The light emitting diode of claim 1, wherein the plurality of three-dimensional nano-structures is aligned side by side and extends to form a plurality of concentric circles or concentric rectangles.

9. The light emitting diode of claim 1, wherein the plurality of the three-dimensional nano-structures is periodically aligned, and a period of the plurality of the three-dimensional nano-structures ranges from about 100 nanometers to about 500 nanometers.

10. The light emitting diode of claim 1, wherein a distance between each two adjacent three-dimensional nano-structures ranges from about 0 nanometers to about 200 nanometers.

11. The light emitting diode of claim 1, wherein a width of the plurality of three-dimensional nano-structures ranges from about 100 nanometers to about 300 nanometers.

12. The light emitting diode of claim 1, wherein a surface of the first semiconductor layer away from the substrate comprises a first region and a second region, the second semiconductor layer and the active layer are located on the first region, the second region is exposed from the second semiconductor layer and the active layer, and the first electrode is located on the second region.

13. The light emitting diode of claim 1, further comprising a plurality of three-dimensional nano-structures located on the surface of the active layer away from the first semiconductor layer.

14. The light emitting diode of claim 13, wherein the alignment and distribution of the three-dimensional nano-structures located on the active layer is the same as the alignment and distribution of the three-dimensional nano-structures located on the first semiconductor layer.

15. The light emitting diode of claim 1, further comprising a reflector located on a surface of the substrate away from the first semiconductor layer.

16. A light emitting diode, comprising:
a substrate having an epitaxial growth surface and a light emitting surface opposite the epitaxial growth surface;
a first semiconductor layer having a first surface contacting the substrate and a second surface opposite to the first surface;
an active layer stacked on the second surface of the first semiconductor layer;
a second semiconductor layer stacked on the active layer;
a first electrode electrically connected with the first semiconductor layer;
a second electrode electrically connected with and covering a surface of the second semiconductor layer away from the active layer; and
a plurality of three-dimensional nano-structures located on the second surface of the first semiconductor layer and a surface of the second semiconductor layer away from the active layer, wherein each of the plurality of three-dimensional nano-structures has a first peak and a second peak aligned side by side, a first groove is defined between the first peak and the second peak, a second groove is defined between each two adjacent three-dimensional nano-structures of the plurality of three-dimensional nano-structures, and a depth of the first groove is less than a depth of the second groove.

17. The light emitting diode of claim 16, further comprising a plurality of three-dimensional nano-structures located on a surface of the active layer away from the first semiconductor layer.

18. The light emitting diode of claim 16, wherein the first surface of the first semiconductor layer is engaged with the plurality of three-dimensional nano-structures located on the substrate.

19. A light emitting diode, comprising:
a substrate having an epitaxial growth surface and a light emitting surface opposite the epitaxial growth surface;
a first semiconductor contacting the substrate;
an active layer stacked on the substrate;
a second semiconductor layer stacked on the active layer;
a first electrode electrically connected with the first semiconductor layer;
a second electrode electrically connected with and covering the second semiconductor layer; and
a plurality of three-dimensional nano-structures located on at least one surface of the active layer, and on at least one of the light emitting surface and a surface of the second semiconductor layer away from the active layer, wherein a cross section of each of the plurality of three-dimensional nano-structure is M-shaped.

20. The light emitting diode of claim 19, wherein the plurality of three-dimensional nano-structures on at least one surface of the active layer extends substantially along a first direction, the plurality of three-dimensional nano-structures on at least one of the light emitting surface and a surface of the second semiconductor layer away from the active layer extends substantially along a second direction, and the first direction is substantially parallel with the second direction.

* * * * *